United States Patent [19]

Pearson

[11] 4,080,570
[45] Mar. 21, 1978

[54] PANEL MOUNTING FOR ELECTRICAL DEVICE

[75] Inventor: David B. Pearson, Raritan, N.J.

[73] Assignee: Sangamo Weston, Inc., Springfield, Ill.

[21] Appl. No.: 738,305

[22] Filed: Nov. 3, 1976

Related U.S. Application Data

[62] Division of Ser. No. 532,245, Dec. 12, 1974, Pat. No. 3,997,840, which is a division of Ser. No. 391,496, Aug. 24, 1973, Pat. No. 3,882,389, which is a division of Ser. No. 173,425, Aug. 20, 1971, Pat. No. 3,764,909.

[51] Int. Cl.² .......................... G01R 1/04; G12B 9/08
[52] U.S. Cl. ................................. 324/156; 248/27.1; 361/369
[58] Field of Search ...................... 324/156, 149, 157; 317/105–110; 85/32 V; 151/11, 22; 248/27.1, 27.3; 339/126 J, 126 RS, 130 R, 130 C

[56] References Cited

U.S. PATENT DOCUMENTS

| | | | |
|---|---|---|---|
| 1,806,295 | 5/1931 | Kinnard | 324/156 X |
| 1,918,940 | 7/1933 | Triplett | 324/156 |
| 2,515,021 | 7/1950 | Simpson | 324/156 |
| 2,517,171 | 8/1950 | Bernreuter | 324/156 |
| 2,517,364 | 8/1950 | Torresen | 85/32 V |
| 3,006,003 | 10/1961 | Johnson | 85/32 V X |
| 3,842,877 | 10/1974 | Andrews | 85/32 V X |

*Primary Examiner*—Gerard R. Strecker
*Attorney, Agent, or Firm*—William R. Sherman; Kevin McMahon; Walter Kruger

[57] ABSTRACT

An electrical device such as a panel meter with a body including an abutment, is inserted through an opening in a panel with the abutment on one side of the panel, and is secured to the panel with a nut plate on the other side of the panel. The body of the meter has plural teeth, discontinuous around the periphery of the body and the teeth extend from opposite sides of the body. The nut plate has an opening with flexible sides to enable snapping the nut plate over the body and teeth to a position abutting the panel to clamp the meter to the panel. Portions of the opening in the nut plate are enlarged so that moving the nut plate to a position in which the body teeth are adjacent the enlarged portions of the opening releases the nut to permit immediate and rapid removal of the meter from the panel. There are several teeth at each side of the body to enable mounting and securing the meter in panels of substantially different thicknesses. Spacers on a front face of the nut plate permit the resilient sides of the nut plate to be snapped over the meter body teeth close to the panel while spacing the nut plate from the panel so the nut plate exerts a bias or pull on the meter which maintains the meter firmly in position on the panel, irrespective of the thickness of the panel.

17 Claims, 6 Drawing Figures

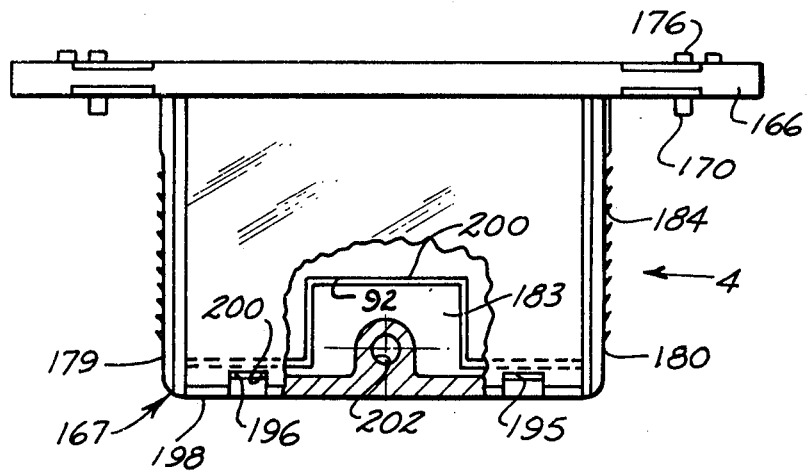
Fig. 3
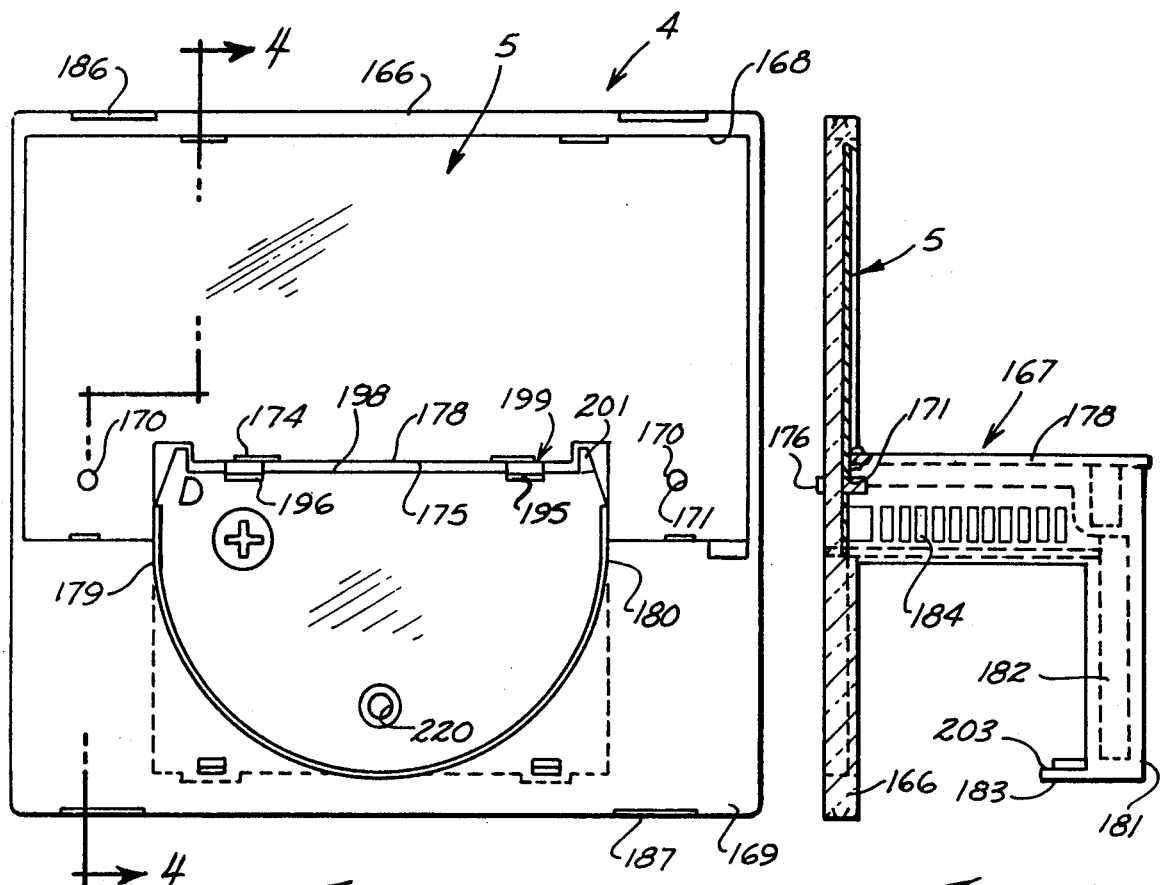
Fig. 2
Fig. 4

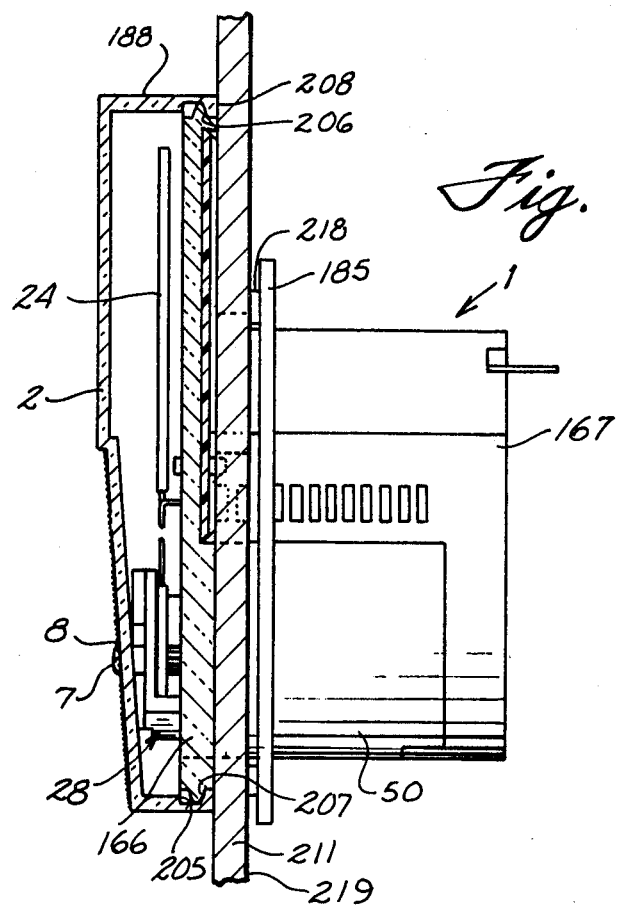
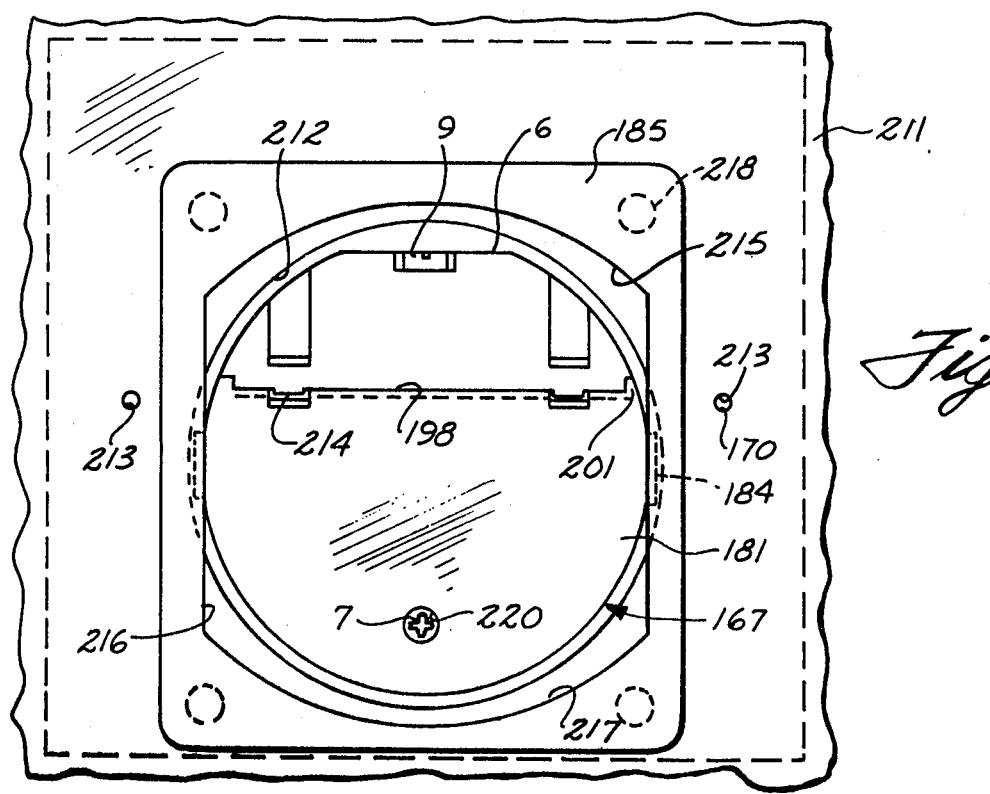

PANEL MOUNTING FOR ELECTRICAL DEVICE

This is a division of my copending applicaton Ser. No. 532,245, filed Dec. 12, 1974, now U.S. Pat. No. 3,997,840, which is a division of Ser. No. 391,496, filed Aug. 24, 1973, now U.S. Pat. No. 3,882,389 which is a division of application Ser. No. 173,425, filed Aug. 20, 1971, and which issued as U.S. Pat. No. 3,764,909 on Oct. 9, 1973.

This invention relates to a panel meter with a unique casting arrangement. More particularly, the invention relates to a panel meter having a unique casing arrangement which permits adding calibrating resistors or rectifiers to the meter after the meter is assembled, by the simple expedient of mounting such components in an adapter which cooperates with the meter casing to provide a compartment on the casing. The meter can be panel mounted either with or without the adapter, in a panel opening of predetermined size.

More specifically, the invention relates to a panel meter having a base for its meter movement which cooperates with a casing to provide a compartment housing the meter movement. The casing is of a part cylinder configuration (a segment of a cylinder) slightly greater than 180° in circumferential extent, and has a platform for receiving an adapter which is also in the form of a cylinder segment, the adapter and the casing cooperating to provide a generally cylindrical casing arrangement.

A distinct advantage of this panel meter casing construction is that the same meter movement, mounted on a base, can be used to provide various different sizes of meters with different deflection and measuring characteristics. Where resistors are used to vary the sensitivity of the meter, these resistors can be added after the meter is assembled. Similarly, where the meter is to be used for the measurement of alternating current, the meter can be adapted to such measurement by adding rectifiers within the adapter chamber, after the meter is assembled. Calibration of the meter can be accomplished by magnetizing the magnet of the meter after assembly.

Panel mounting is substantially simplified by use of a flexible Tinnerman type nut cooperating with preformed ratchet teeth on the body of the meter casing. The teeth and nut are so constructed that the same nut can be used to secure the meter in an opening of predetermined size in a panel, whether or not the adapter is used. In addition, only a single size opening is required for mounting any of a family of different size meters, whether or not the adapter is used. Advantageously, the various casing parts of the meter are of snap together construction so that the meter can be easily installed in its casing after the basic meter movement is assembled.

Numerous additional features and advantages of the invention will become apparent with reference to the drawings which form a part of this specification.

BRIEF DESCRIPTION OF THE DRAWINGS

FIG. 2 is a rear view of the meter case;

FIG. 3 is a top plan view of the meter case of FIG. 2 with portions broken away to show additional details;

FIG. 4 is a view in section taken along line 4—4 of FIG. 2;

FIG. 5 is a side view in section of the assembled meter taken along line 5—5 of FIG. 6 and showing the assembled meter mounted on a panel; and FIG. 6 is a rear view of the meter mounted on a panel and showing the panel mounting nut.

THE METER ASSEMBLY

Figure 1:
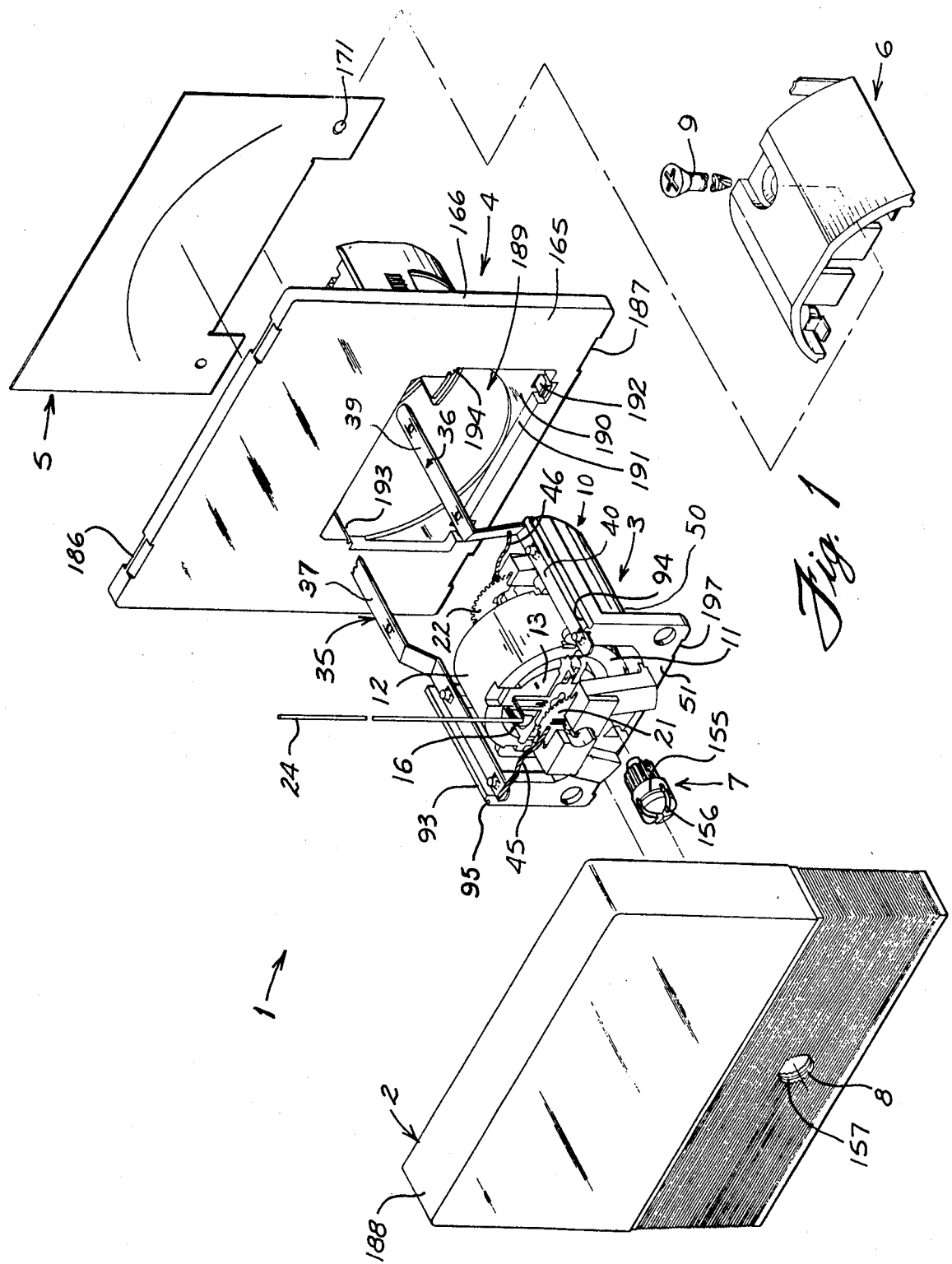
FIG. 1 is an exploded pictorial view of a panel meter having a casing and adaptor in accordance with this invention.

Referring now to the drawings and particularly to FIG. 1 there is shown a meter 1 constructed in accordance with this invention. As shown at FIG. 1, the meter includes a cover 2, a meter movement 3, a case 4, a scale 5 and a terminal adapter assembly 6. In addition, there is a zero adjust knob 7 which is mounted for rotation in an opening 8 in cover 2. The various parts of the meter so far described are adapted to be assembled by sliding and/or snapping these parts together with the exception of the terminal adapter 6 which is held in position by the screw 9, and which is only used where a particular meter terminal is needed.

A supporting base 10 supports all the components of meter movement 3. These components include upper and lower yoke pieces 11 and 12 between which is a permanent magnet 13, a coil assembly 16, supported by metal support elements 21 and 22 via metal taut bands, and conductors to electrically connect the coil to external terminals. A pointer 24 is mounted on coil assembly 16.

External electrical connections to the support elements 21 and 22 are made via the rigid terminal conductors 35 and 36 which are mounted on top of the base, and the terminal adaptor 6, when used. As shown at FIG. 1, conductors 35 and 36 are each formed from flat strips of metal and have good electrically conducting characteristics. Terminal 35 is bent intermediate its ends to elevate rear leg 37 of the conductor relative to front leg 38. Identically, conductor 36 is bent intermediate its ends so rear leg 39 is offset from and above front leg 40.

Conductor 35 is electrically connected to front support element 21 by a flexible braided wire conductor 45. Similarly, rear support element 22 is electrically connected to conductor 36 by a braided wire 46.

Base 10 is an integral structure molded from an electrically insulating plastic material with dimensionally stable characteristics, advantageously, a polysulfone material. The base has a front flange 51 and a rearwardly projecting side wall 50.

Projecting upwardly from wall 50 are longitudinal ribs 93 and 94. Each rib extends the length of the side wall as shown at FIG. 1 and has a groove 95 which seats in a mating projection in case 4 to hold the base against movement.

Case 4 is molded from an optically clear plastic material such as polystyrene. With reference to FIGS. 1–4, case 4 includes a face plate 166 and an integrally formed body 167 extending rearwardly from the face plate. Face plate 166 is generally rectangular and has a shallow recess 168 formed in the upper portion of its rear surface 169 to receive scale 5.

Scale 5 is precisely positioned in recess 168 by integrally formed cylindrical locating pins 170 which project rearwardly from face plate 166 and are received in locating openings 171 in the scale.

As shown at FIGS. 1–4, body 167 has a flat top wall 178 and side walls 179 and 180 which project downwardly from the top wall. There is also a rear wall 181 of slightly greater than semi-circular outline. A semi-circular flange 182 projects forwardly from rear wall 181. At the bottom of flange 182 is a forwardly projecting tab 183. Formed on the side walls 179 and 180 are ratchet type teeth 184 which face toward face plate 166 and provide for gripping a snap-on type retaining nut 185 (FIGS. 5 and 6) to facilitate mounting the meter on the front face of a panel.

Formed in the top edge of face plate 166 are a pair of notches 186 and formed at the bottom edge of the face plate are a pair of notches 187. As shown at FIG. 1, face plate 166 has a semi-circular opening 189 formed therein, the lower edge of which is defined by a wall 190 with a concave top edge. Extending from the front surface of the face plate to the wall 190 is a recess 191 with square lower corners. The bottom edge of the recess is notched to accommodate a pair of resilient, forwardly projecting latch fingers 192 integrally formed with case 4.

At the sides of opening 189, adjacent the upper portion of the opening are tracks 193 and 194 dimensioned to mate respectively with ribs 93 and 94. Tracks 193 and 194 extend the length of body 167 and permit sliding the base and meter movement into a seated position in the case. Horizontally elongated openings 195 and 196 are provided in rear wall 181 to receive conductors 35 and 36 of the meter movement 3.

The top of wall 178 of body 167 is provided with a step 198 in its rear edge as shown at FIGS. 2 and 3. This step terminates slightly above the openings 195 and 196. The opeings 195 and 196 are each defined by an L-shaped notch 199 which extends through both the top wall 178 and rear wall 181. In addition, it will be observed with reference to FIG. 2 that the body 167 has upwardly projecting longitudinally extending ribs 201 along the opposite sides of top wall 178. Step 198 and ribs 201 provide a seat for conveniently mounting adapter assembly 6 on top of body 167. The rear of body 167 is provided with a thickened portion centrally thereof in which a blind opening 202 is formed to receive the screw 9 for securing the terminal adapter 6 to the casing.

To mount meter movement 3 in case 4, it is merely necessary to align ribs 93 and 94 at the top of base 10 with the tracks 193 and 194 of the case. The conductors 35 and 36 carried by the base 10 are substantially rigid and are accurately positioned on the base in alignment with the openings 195 and 196 respectively in rear wall 181. Hence, the assembled meter movement can be readily slipped into a seated position in the base merely by sliding the meter movement rearwardly until notches 197 on the bottom surface of the base snap over the retaining fingers 192 adjacent the front of the case 4. In this seated position of the meter movement, the rear face of flange 51 abuts the front face of wall 190, conductors 35 and 36 extend through the respective openings 195 and 196 in rear wall 181, and tab 183 seats in the recess 92 at the rear of the base. The position of the meter movement in the case 4 is shown at FIG. 5, where it is seen that the front support structure 28 projects slightly in front of the front surface of face plate 166. Side wall 50 of supporting base 10 forms a close fit with body 167 and tab 183 of the case to prevent dust from entering the assembly. In this regard, it will be observed with reference to FIGS. 3 and 4 that tab 183 has a flanged edge 203 which seats in a mating recess formed in the rear portion of the base along the side edges of the recess 92 of the base.

Cover 2 is formed from an optically clear plastic material such a polystyrene; is generally rectangular, and has a side wall 188 of a size to fit over face plate 166.

The rear of side wall 188 has a rectangular recess with an inner edge 205 that forms an abutment surface against which the front surface of face plate 166 abuts when the cover is in position on the face plate. Formed at the rear edge of the cover are pairs of locking lugs 206 and 207 which are spaced apart and arranged to snap over the pairs of notches 186 and 187 of the face plate so the cover can be quickly snapped into position on the face plate and yet is held against accidental removal. As shown at FIG. 5 the rear edge 208 of side wall 188 is flush with the rear surface of face plate 166.

The assembled meter 1 is particularly adapted to be mounted on a flat mounting panel 211 which has a circular opening 212 to receive the body 167 of the case as shown at FIGS. 5 and 6. In addition, the panel 211 is advantageously provided with a pair of locating openings 213 spaced apart the same distance as scale locating pins 170 formed on the rear face of face plate 166. When pins 170 are inserted in the openings 213 the meter assembly is oriented in a predetermined angular position and cannot be turned.

If desired, the terminal adapter 6 can be mounted on the top wall of body 167 between ribs 201. Terminal adapter 6 is hollow to provide space for additional circuit components such as a rectifying bridge where the meter is used to measure alternating current. The adapter 6 is secured to body 167 by threading the screw 9 into the opening 202 (FIG. 3) at the rear of the body. The single screw 9 holds the adapter securely because ribs 201 prevent the adapter from shifting.

The electrical connection between the meter movement and adapter 6 is also quite simply accomplished by bending the conductors 35 and 36 which extend through the respective openings 195 and 196 upwardly and then over top wall 178 so these conductors are within the body of adapter 6. Electrical connections between the conductors 35 and 36 and the circuitry within adapter 6 can be accomplished by welding before the conductors are bent.

As shown at FIG. 6, adapter 6 has a pair of downwardly projecting tabs 214 which close the openings 195 and 196 against entry of dust and dirt into the meter casing. The rear wall of the adapter has a downwardly extending lip which seats in step 198 and provides for accurate positioning of the adapter on the body.

Meter assembly 1 is secured to panel 211 by the nut 185. Nut 185 is generally rectangular and has an opening 215 formed therein. Opening 215 has parallel side edges 216 the distance between which is only slightly greater than the width of body 167 as measured between the base portions of the teeth 184. In addition, the straight edges 216 each merge with arcuately curved edges 217 of the opening, the edges 217 being spaced apart a distance greater than the width of the body across the tips of the teeth. On the front face of the nut 185 are spacer buttons 218 which space the corners of nut 185 from rear surface 219 of panel 211. These buttons have a thickness slightly greater than the pitch of the teeth 184 to permit pressing the portions of the nut which engage teeth 184 toward rear surface 219 of the panel so the meter assembly is tightly held against the panel even though there are variations in the thickness of the panel on which the meter assembly is mounted. Hence, the spacer buttons assure that the rear surface of the face plate firmly abuts the front face of panel 211. The meter assembly can be quite simply released from its panel mounting merely by rotating nut 185 so the curved edges 217 are opposite teeth 184. In this position of the nut the teeth are completely disengaged from the nut and the meter can be removed by pushing same forwardly through the opening 212. Since nut 185 does not engage adapter 6, the nut can be used to mount the meter whether or not the adapter is used.

Meter movement 3, as shown at FIG. 1, is easily installed in casing 4. The free ends 37 and 39 of the respective conductors 35 and 36 are spaced apart the same distance as the openings 195 and 196 in the rear wall 181 of casing 4. Hence, as shown at FIG. 1, to mount the meter movement in the casing it is merely necessary to align ribs 93 and 94 at the top of the base with the tracks 193 and 194 in the casing and then slide the meter movement rearwardly until fingers 192 of the casing snap into the notches 197 on the front flange of the base whereupon the meter movement is secured to the casing. As is apparent from FIGS. 1, 5 and 6, side wall 50 of base 10 cooperates with body 167 of the casing to form a compartment or casing means for meter movement 3.

During further assembly, scale 5 is snapped onto the back of face plate 166, zero adjust knob 7 is snapped into the opening 8 of cover 2 and cover 2 is snapped onto face plate 165. The conductors of terminal adapter 6 are connected respectively to the conductors 35 and 36 which now project through the rear of the casing and the terminal adapter 6 is seated on the top wall or platform 178 of the casing and secured with the screw 9. Should rectifiers or additional resistors be required these can conveniently be located in the adapter 6, which is hollow, as shown at FIG. 1. Correspondingly, adapter 6, can be used when desired to provide a compartment separate from the compartment for meter movement 3, and desired calibrating resistors can be mounted in this compartment to provide a meter with desired deflection characteristics. Where an A.C. meter is required, rectifiers can be mounted in the adapter 6. Magnet 15 is then magnetized to calibrate the meter.

As is evident from the proceeding explanation, a distinct advantage of the adapter arrangement is that the meter can be assembled, and can subsequently be provided with calibrating resistors or rectifiers, without disassembly of the meter.

As is apparent from the drawings, the rear of the meter is of a pleasing arcuate profile both with and without adapter 6, and can easily be mounted in opening 212 of panel 211 (FIGS. 5 and 6) either with or without the adapter; where the meter is secured with panel mounting nut 185.

The panel mounting nut 185 is supplied with the meter and in addition, several additional scale plates 5 can also be supplied to permit the user of the meter to simply adapt the meter for various purposes.

It is to be appreciated that the assembled meter can be provided with either the front zero adjust knob shown at FIG. 1 or a rear zero adjust knob, as shown at FIG. 6, or to make the meter even more versatile, a zero adjust knob 7 can be provided at both the front and the back of the assembled meter. This permits any desired subsequent mounting of the meter and hence, increases the versatility of the meter.

A distinct advantage of the meter construction of this invention is the same meter movement 3 can be used for meters of various sizes with no significant additional expense. The only changes required to provide any one of several different size meters are a pointer 24 of the required length for the size of the meter, and a proper counterweight to balance the meter movement. Then, it is merely necessary to select a case, scale, and cover of the appropriate size for the pointer used. It is contemplated that for example, finished meters of a size from 3 inches to 8 inches in increments of 1 inch can be provided without the necessity for any additional manufacturing steps.

While a preferred embodiment of the meter and casing arrangement of this invention have been shown and described in detail it is to be understood that numerous changes can be made in the construction described herein without departing from the spirit and scope of this invention as defined herein and in the appended claims.

What is claimed is:

1. An arrangement for mounting a meter on a panel having an opening comprising, in combination a meter assembly including a casing having a face plate and a body connected to said face plate and projecting rearwardly therefrom; a meter movement in the body and supported by said casing; said body having at least two outwardly facing surfaces; a plurality of teeth on each of said surfaces, said teeth being discontinuous peripherally of said body, said teeth each comprising a generally flat front surface facing toward and parallel with the panel, and a rear surface sloping toward the front surface; said face plate having a rearwardly facing abutment surface adapted to engage a front face of a mounting panel; and a flexible rachet type quick connect nut plate having narrow flexible sides cooperating with said teeth and readily movable over said body so that the nut snaps over said teeth upon movement in a direction toward said face plate to clamp said mounting panel between said nut plate and face plate to secure said meter to a panel.

2. A meter mounting arrangement according to claim 1 wherein, said quick connect nut plate comprises a member of thin flexible material of uniform thickness, said sides having opposed parallel tooth engaging edges thereon, said member further having recesses between the bounds of said parallel edges and of a width at least as great as the width across said teeth; whereby said meter can be readily demounted by turning said nut to a position in which said recesses align with said teeth.

3. A meter mounting arrangement according to claim 1 wherein, said mounting opening in the panel is circular; and said body and meter movement therein present a surface of at least partial cylindrical configuration.

4. A meter mounting arrangement according to claim 1 wherein, said face plate has a recessed rear surface; a scale plate with indicia thereon is mounted in said recess; and said face plate is of a transparent material; whereby, said scale can be viewed from the front of said face plate.

5. A meter mounting arrangement according to claim 1 wherein said meter assembly further includes a cover having a face plate receiving recess therein, and stop means on said cover and within said recess to limit the extent of insertion of said face plate into said cover such that the rear edges of said cover are essentially coplaner with the rear surface of said face plate; whereby said cover does not interfere with the clamping of the meter assembly against said mounting panel.

6. A meter mounting arrangement according to claim 1 wherein casings with face plates of different sizes each have the same size body; and meter movements with pointers of different lengths are of the same size to be received in said body; whereby a meter of a selected size can be installed in a panel having an opening of a predetermined single size.

7. A meter mounting arrangement according to claim 1 wherein said body presents an outline which is the segment of a cylinder; said opening in said panel is circular; and an adapter element cooperates with said body to form a body assembly of greater cylindrical extent then said body whereby; said adapter can, if desired, be positioned on said body prior to mounting said meter assembly on said mounting panel.

8. A mounting arrangement for mounting an electrical device such as a meter on a panel having an opening comprising, in combination, an electrical device having a body extending through the panel opening, abutment means on the body for positioning the body with respect to one face of the panel, plural teeth on said body, said teeth being discontinuous about the body, quick connect ratchet nut means on the body on the opposite side of the panel from said abutment means for clamping the panel between the abutment means and the nut means to secure the device to the panel, said nut means comprising a thin nut having an opening with first narrow flexible side portions dimensioned to snap over and engage selected teeth of said body, so that the nut means can be moved along a straight line, in ratchet fashion to a clamping position with said panel and second side portions dimensioned to clear said teeth, said nut being movable from said clamping position in which the first portions engage said teeth to secure the device to the panel, to a released position in which the second side portions are adjacent said teeth and the first side portions are disengaged from the teeth.

9. A mounting arrangement according to claim 8 wherein said abutment means on the body comprises, a face plate integral with the body.

10. A mounting arrangement according to claim 8 wherein, said plural teeth comprise, a first row of teeth extending along one side of the body, and a second row of teeth extending along an opposite side of the body.

11. A mounting arrangement according to claim 8 wherein said mounting arrangement further includes means for spacing the side portions from the panel so that the side portions can be snapped axially of the body over teeth closely adjacent the panel to clamp the electrical device to the panel.

12. A mounting arrangement according to claim 11 wherein said means for spacing includes spacers integral with and projecting from one face of said nut.

13. A mounting arrangement for mounting an electrical device such as a meter on a panel having an opening comprising, in combination, an electrical device having a body extending through the panel opening, abutment means on the body for positioning the body with respect to one face of the panel, plural teeth on said body, said teeth being discontinuous about the body, quick connect nut means on said body engaging selected ones of said teeth for clamping the panel between the abutment means and the nut means, said nut means including flexible side portions engaging said selected teeth, said flexible side portions permitting snapping the nut means along and over the teeth in a straight line to clamp the electrical device to the panel without rotating the nut means, said nut means having an opening defined in part by said flexible portions and in part by additional portions of the nut means, the additional portions having a space therebetween greater than the distance between the flexible portions to enable disengaging the nut means from the teeth by moving the nut means to a position in which the additional portions are in opposed relation to said teeth.

14. A mounting arrangement according to claim 13 wherein the arrangement further includes, spacer means on the nut means between the panel and a front face of the nut means for urging the nut means away from the panel to maintain the electrical device clamped to the panel.

15. A mounting arrangement according to claim 13 wherein said plural teeth are ratchet teeth in spaced apart rows along said body to facilitate snapping said nut means along the teeth to a panel clamping position securing the electrical device to the panel.

16. A mounting arrangement according to claim 13 wherein said body comprises a generally segment shaped body, said teeth comprise rows of teeth diametrically disposed on said body, and an adapter is seated on said body, said opening in said nut means being dimensioned to extend over both said body and adapter to secure the electrical device to the panel.

17. A mounting arrangement according to claim 14 wherein, said spacer means comprise unitary projections on said nut means spaced laterally from the narrow flexible tooth engaging portions of the nut means.

* * * * *